(12) United States Patent
Singer et al.

(10) Patent No.: US 7,542,217 B2
(45) Date of Patent: Jun. 2, 2009

(54) BEAM RESHAPING UNIT FOR AN ILLUMINATION SYSTEM OF A MICROLITHOGRAPHIC PROJECTION EXPOSURE APPARATUS

(75) Inventors: Wolfgang Singer, Aalen (DE); Markus Deguenther, Aalen (DE); Birgit Kuerz, Aalen (DE); Rafael Egger, Aalen (DE); Johannes Wangler, Koenigsbronn (DE); Manfred Maul, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 760 days.

(21) Appl. No.: 11/015,312

(22) Filed: Dec. 17, 2004

(65) Prior Publication Data
US 2005/0219495 A1 Oct. 6, 2005

Related U.S. Application Data

(60) Provisional application No. 60/531,436, filed on Dec. 19, 2003.

(51) Int. Cl.
G02B 13/08 (2006.01)
G02B 3/02 (2006.01)
G02B 9/00 (2006.01)
G02B 3/00 (2006.01)
G03B 27/54 (2006.01)

(52) U.S. Cl. .......................... 359/709; 359/649; 355/67
(58) Field of Classification Search ................. 359/649, 359/650, 642, 641, 618, 626, 708, 676, 694, 359/717; 355/67
See application file for complete search history.

(56) References Cited

U.S. PATENT DOCUMENTS

| 1,988,946 | A | 1/1935 | Hauser et al. |
|---|---|---|---|
| 2,298,742 | A | 10/1942 | Larose |
| 2,351,736 | A | 6/1944 | Benford |
| 2,759,393 | A | 2/1956 | Mcleod |
| 2,882,784 | A | 4/1959 | Toffolo |
| 3,848,970 | A | 11/1974 | Goodell |
| 3,947,093 | A | 3/1976 | Goshima et al. |
| 4,109,304 | A | 8/1978 | Khvalovsk et al. |
| 4,127,318 | A | 11/1978 | Determann et al. |
| 4,292,663 | A | 9/1981 | Martino et al. |
| 4,317,613 | A | 3/1982 | Grosser |
| 4,426,696 | A * | 1/1984 | Brenden et al. ........ 369/112.25 |
| 4,626,082 | A | 12/1986 | Mochizuki et al. |
| 4,637,691 | A | 1/1987 | Uehara et al. |
| 4,834,671 | A | 5/1989 | Vigna et al. |
| 4,842,393 | A | 6/1989 | Gorman et al. |
| 4,997,250 | A | 3/1991 | Ortiz, Jr. |

(Continued)

FOREIGN PATENT DOCUMENTS

DE 0 747 772 4/1996

(Continued)

*Primary Examiner*—Alicia M Harrington
(74) *Attorney, Agent, or Firm*—Fish & Richardson P.C.

(57) ABSTRACT

A beam reshaping unit for an illumination system of a microlithographic projection exposure apparatus includes a first beam reshaping element having a first beam reshaping surface and a second beam reshaping element having a second beam reshaping surface which faces the first beam reshaping surface. The two beam reshaping surfaces are rotationally symmetrical with respect to an optical axis of the beam reshaping unit. At least the first beam reshaping surface has a concavely or convexly curved region.

24 Claims, 12 Drawing Sheets

U.S. PATENT DOCUMENTS

| | | | |
|---|---|---|---|
| 5,025,438 A * | 6/1991 | Emoto | 369/112.28 |
| 5,331,457 A | 7/1994 | Hanzawa et al. | |
| 5,345,292 A | 9/1994 | Shiozawa et al. | |
| 5,357,312 A | 10/1994 | Tounai | |
| 5,452,054 A | 9/1995 | Dewa et al. | |
| 5,646,715 A | 7/1997 | Wangler | |
| 5,675,401 A | 10/1997 | Wangler et al. | |
| 6,259,512 B1 | 7/2001 | Mizouchi | |
| 6,285,443 B1 | 9/2001 | Wangler et al. | |
| 6,377,336 B1 | 4/2002 | Shiraishi et al. | |
| 6,392,740 B1 | 5/2002 | Shiraishi et al. | |
| 6,452,662 B2 | 9/2002 | Mulkens et al. | |

FOREIGN PATENT DOCUMENTS

| | | |
|---|---|---|
| WO | WO 2004-102230 A1 | 11/2004 |

* cited by examiner

BEAM RESHAPING UNIT FOR AN ILLUMINATION SYSTEM OF A MICROLITHOGRAPHIC PROJECTION EXPOSURE APPARATUS

CROSS-REFERENCE TO RELATED APPLICATIONS

This application claims priority of U.S. provisional patent application Ser. No. 60/531,436, filed Dec. 19, 2003.

BACKGROUND OF THE INVENTION

1. Field of the Invention

The invention relates to a beam reshaping unit for an illumination system of a microlithographic projection exposure apparatus. Such apparatuses are used to produce large-scale integrated circuits and other micro-structured components.

2. Description of Related Art

In the production of micro-structured components, a plurality of structured layers is applied to a suitable substrate, which can be, for example, a silicon wafer. To structure the layers, these are first covered with a photosensitive resist which is sensitive to light of a particular wavelength range, e.g. light in the deep ultraviolet spectral range (DUV, deep ultraviolet). The wafer coated in this way is then exposed to light in a projection exposure apparatus. Such an apparatus comprises an illumination system and a projection lens. The illumination system illuminates a mask that contains a pattern of structures to be imaged onto the resist with the aid of a projection lens. Since the magnification is generally less than 1, such projection lenses are often referred to as reduction lenses.

After the resist has been developed, the wafer is subjected to an etching or separating process. As a result of this process the top layer is structured according to the pattern on the mask. The remaining resist is then removed from the remaining parts of the layer. This process is repeated until all layers are applied to the wafer.

The efficiency of the projection exposure apparatuses is not only determined by the imaging properties of the projection lens but also by the properties of the illumination system that illuminates the mask. The illumination system contains a light source, e.g. a pulsed laser, and a plurality of optical elements which generate a projection light bundle having the desired properties. Amongst other things, these properties include the angular distribution of the light rays which form the projection light bundle.

Generally at the fore here is the angular distribution of the projection light in the plane into which the mask is introduced during the exposure. If the angular distribution of projection light is specifically adapted to the pattern contained in the mask, this pattern can be imaged with improved image quality onto the wafer covered with the photosensitive resist.

The angular distribution of projection light in the mask plane is often not described as such, but as an intensity distribution in a conjugate pupil plane. This exploits the fact that angles formed between the optical axis and light rays passing a field plane correspond to radial distances at which the respective light rays pass a pupil plane. In a so-called conventional illumination setting, for example, the region illuminated in such a pupil plane is a circular disc which is concentric with the optical axis. At each point in the field plane, light rays therefore impinge with angles of incidence between 0° and a maximum angle determined by the radius of the circular disc.

In so-called non-conventional illumination settings, e.g. ring field, dipole or quadrupole illuminations, the region illuminated in the pupil plane has the shape of a ring which is concentric with the optical axis, or a plurality of separate areas arranged off the optical axis. In these non-conventional illumination settings, only oblique rays illuminate the mask.

To generate an angular distribution of projection light that is optimally adapted to the mask, an optical raster element is generally used, which can be for example a diffractive optical element (DOE) or a microlens array. Further examples of such raster elements are described in U.S. Pat. No. 6,285,443 assigned to the applicant. When changing between different illumination settings, e.g. from a conventional setting to a quadrupole setting, it is generally necessary to change the optical raster element. For fine tuning the angular distribution of illumination, and also to generate annular illumination settings, known illumination systems generally have a zoom axicon objective having an object plane in which the first optical raster element is arranged.

An example of such an illumination system having a zoom axicon objective is described in EP 747 772 A. The zoom axicon objective combines a zoom function for the continuously variable adjustment of the diameter of a light distribution and an axicon function for the radial redistribution of light intensities. The axicon system comprises two mutually axially displaceable axicon elements having mutually facing conical axicon surfaces which can be moved towards one another until they are at zero spacing. By adjusting the zoom axicon objective, it is possible to set different annular intensity distributions in an exit pupil of the zoom axicon objective and, in conventional illumination settings, different degrees of coherence. A second optical raster element, which is located in the exit pupil of the zoom axicon objective, is illuminated with the light distribution, which is generated by the first optical raster segment and the zoom axicon objective, and produces an illuminated field in the mask plane.

Other illumination systems having axicon systems for the radial redistribution of light energy are described, for example, in U.S. Pat. Nos. 5,675,401, 6,377,336 and 6,452,662 assigned to the applicant.

Common to the known axicon systems is the fact that, although the illuminated regions in the pupil plane have the desired geometries, the light intensity distributions within these regions are not satisfactory.

SUMMARY OF THE INVENTION

Therefore it is an object of the present invention to provide a flexibly usable beam reshaping unit for illumination systems used in microlithographic projection exposure apparatuses.

This object is achieved by a beam reshaping unit which comprises a first beam reshaping element having a first beam reshaping surface and a second beam reshaping element having a second beam reshaping surface which faces the first beam reshaping surface. The first beam reshaping surface and the second beam reshaping surface are rotationally symmetrical with respect to an optical axis of the beam reshaping unit. At least the first beam reshaping surface has a curved nonconical region.

With the aid of a concavely or convexly curved nonconical region, it is possible to introduce refractive power. This refractive power may be used, for example, to concentrate light specifically onto individual regions in the pupil plane or to distribute it over a wider area. Thus, the distribution of light energy within those regions of the pupil plane to be illuminated can be specifically influenced and, particularly, can be homogenized.

If the curvature of the first beam reshaping surface within the curved region is finite, the region has no "peaks" or "holes" where the beam reshaping surface is not continuously differentiable. Depending on the design of the beam reshaping unit, points having an infinite curvature, e.g. on the optical axis, can however be tolerated or are even desirable.

The region may be a central region surrounding the optical axis. A central region of one or both beam reshaping surfaces which is curved in this way has the advantage that the beam reshaping unit generates an additional lens effect at least in the region close to the optical axis. For example, with a convexly curved central region, light can be directed specifically into the centre of the pupil plane. In the case of beam reshaping elements having conical beam reshaping surfaces, the centre has a tip that results in a dark spot in the center of the pupil plane.

This aspect is particularly significant for conventional illumination settings having a small degree of coherence since, in these illumination settings, the pupil plane is only illuminated within a very small region around the optical axis.

As a result of the additional lens effect in the region near to the axis, it is moreover possible to achieve an additional zoom effect—particularly for conventional illumination settings with a small degree of coherence—upon displacement of a beam reshaping element along the optical axis.

In the simplest case, the central region of the first beam reshaping surface is surrounded by a conical outer region. Therefore, the beam reshaping surfaces only differ from the conventionally used conical surfaces in axicon elements in terms of their central region.

However, as an alternative to this, the central region of the first beam reshaping surface may be surrounded by a curved outer region whose curvature is qualitatively opposed to the curvature of the central region. This means that, with a concave curvature of the central region, the outer region is convexly curved and vice versa. The amounts of curvature in the central region and in the surrounding outer region may differ. If the curvature in the central region merges continuously into the curvature in the outer region, the transition between the central region and the outer region is determined by the line where the curvature equals zero.

In many cases, it is favorable to provide a convexly curved central region of the first beam reshaping surface of the first beam reshaping element as seen in the light propagation direction. The light entry surface of the first beam reshaping element in the light propagation direction may be convexly curved. The second, subsequent beam reshaping element in the beam path may have, for example, a planar or a convex light exit surface.

According to another aspect of the invention, a beam reshaping surface may be defined by rotating a curve segment about the optical axis. The curve segment has a continuous curvature distinct from zero and forms an angle $\alpha \neq 90°$ with the optical axis. The curve segment may have a curvature that is defined by a spline function, for example. Beam reshaping elements having curved surfaces of this type will be referred to in the following as "lensacons". Suitable determination of the curve segment enables an annular illuminated region in the pupil plane to alter its diameter or width, but not its overall area, upon adjustment of the axial spacing between the two beam reshaping elements. Furthermore, the curve segments may be determined such that the intensity of the light in the pupil plane is at least approximately constant over the illuminated regions.

If the beam shaping element shall have the property that parallel light rays impinging thereon are all diverted by the same angle (and vice versa), this may be achieved, for example, by a beam shaping element that has one conventional spherical surface and a beam reshaping surface that is defined by rotating a non-circular curve segment in the manner described above.

Generally, the curve segments may be designed, for example, such that the first beam reshaping surface has at no point a surface normal aligned parallel with the optical axis. In an advantageous exemplary embodiment, on the other hand, the surface normal is aligned parallel with the optical axis on a circle of the first beam reshaping surface, said circle being concentric with the optical axis and having a smaller diameter than the diameter of the element. The first beam reshaping surface then has a toroidal elevation or depression. Such a design is particularly advantageous if annular illumination settings are preferred, since the light can then be directed through the toroidal regions.

A specific type of such a lensacon lens results from a design rule in which spherical or aspherical surfaces of conventional lenses are inverted such that the surfaces perpendicularly intersect a surface of a regular cylinder that is concentrical with the optical axis. Such inverted lenses have also, at least in certain respects, "inverted" optical properties that may be exploited, for example, in beam reshaping objectives, but also in other optical systems.

According to another advantageous embodiment, the first beam reshaping element is positioned in front of the second beam reshaping element in a light propagation direction, and the first beam reshaping surface is convexly curved and the second beam reshaping surface is concavely curved. This reversed order of the curvatures, compared to conventional axicon elements, allows to better distribute the light energy over annular regions in the pupil plane of the illumination system.

The second beam reshaping surface may be formed as the negative of the first beam reshaping surface, as is also the case with conventional axicon systems, so that the first and the second beam reshaping surfaces may be substantially seamlessly joined together.

If, owing to the form of the selected curve segments that define the lensacons, collimated light which is incident on an entry surface of the beam reshaping unit does not exit this system as a reshaped but still collimated beam, it may be expedient to provide a correcting element which may be moved along the optical axis and which can, for example, likewise be constructed as a lensacon.

In another advantageous exemplary embodiment of the invention, an entry surface of the first beam reshaping element and an exit surface of the second beam reshaping element may each be defined by rotating a circle segment about the optical axis. These circle segments are concentric with a point off the optical axis. The entry surface and the exit surface then together form an afocal system which, by definition, does not impair the parallelism of an incident light bundle. Lensacon surfaces arranged therebetween can be designed such that, when the two beam reshaping elements are moved apart, the parallelism of the light bundle is also maintained in the space between the beam reshaping elements.

The beam reshaping unit may comprise a zoom unit having at least one optical element which is adjustable in the direction of the optical axis. The zoom unit can be mounted in front of the beam reshaping elements, for example in the light propagation direction, as is also the case in conventional zoom axicon objectives, but also behind the axicon elements.

The spacing between the two beam reshaping elements may be adjustable in the direction of the optical axis. However, the adjustability can result in the beam reshaping elements possibly tilting slightly relative to the optical axis.

In order to prevent this, the two beam reshaping elements can be non-adjustably fixed with respect to the optical axis. The adjustability of the beam reshaping elements is then replaced by at least one (possibly additional) zoom element which is arranged between the two beam reshaping elements. This design can not only be advantageously used with beam reshaping elements having curved beam reshaping surfaces, but also with beam reshaping elements having conventional conical beam reshaping surfaces.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
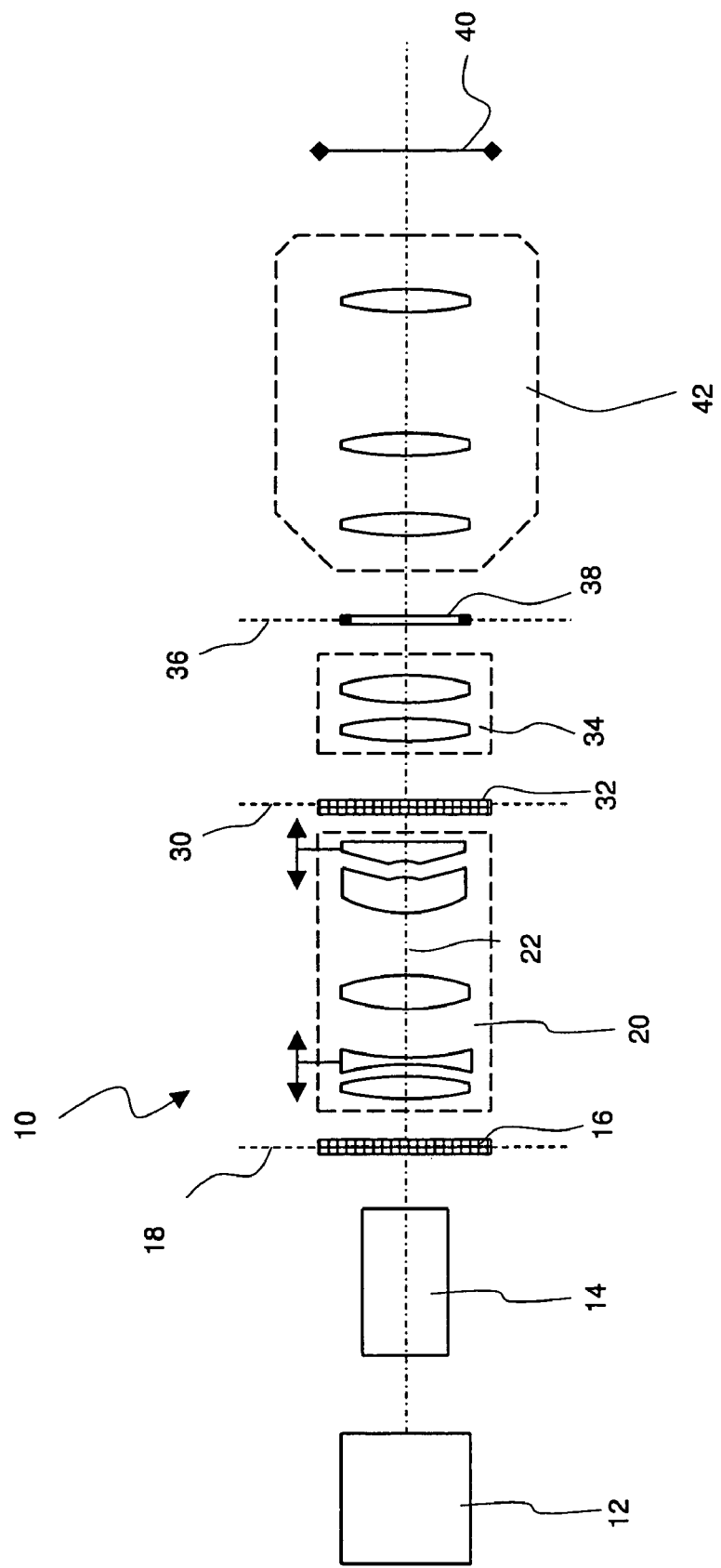
FIG. 1 shows an illumination system of a microlithographic projection exposure apparatus in a greatly simplified meridional section.

FIG. 1 shows in a simplified meridional section an illumination system that is denoted in its entirety by 10. The illumination system 10 comprises a light source 12 in the form of an excimer laser. The light source 12 generates monochromatic and strongly—but not completely—collimated light with a wavelength in the deep ultraviolet spectral range, e.g. 193 nm or 157 nm.

In a beam expander 14, which may be realized as an adjustable mirror arrangement, the light generated by the light source 12 is expanded into a rectangular and substantially parallel light bundle. The expanded light bundle then passes through a first optical raster element 16, which can be for example a diffractive optical element. Further examples of suitable raster elements are disclosed in U.S. Pat. No. 6,285,443 assigned to the applicant, the full disclosure of which being incorporated herein by reference. The first optical raster element 16 has the task of altering the angular distribution of the projection light and increasing the geometrical optical flux.

The first optical raster element 16 is arranged in an object plane 18 of a beam reshaping objective 20, which enables further modification and continuous adjustment of the angular distribution of illumination. The construction of the beam reshaping objective 20 is explained in more detail below with reference to FIGS. 2 to 15.

A second optical raster element 32 is arranged in a pupil plane 30, which is the exit pupil of the beam reshaping objective 20. The second optical raster element 32 has the task of defining the intensity distribution in a subsequent conjugate field plane.

A second objective 34 is arranged behind the second optical raster element 32, as seen in the light propagation direction. In the image plane 36 of the second objective 34 a masking device 38 is arranged. The masking decive 38 is known as such and has adjustable blades that are often referred to as REMA (REticle MAsking) diaphragm. The masking device 38 determines the shape of the region through which projection light passes on a mask 40. In order to achieve sharp edges around this region, a third objective 42 is provided. In the object plane of the third objective 42 the blades of the masking device 38 are arranged, and in the image plane of the third objective 42 the mask 40 can be introduced by means of a mask stage.

If required, a glass rod for beam homogenisation can also be inserted between the second objective 34 and the masking device 38. The illumination system 10 described in this regard is disclosed in the prior art (c.f., for instance, the above-mentioned U.S. Pat. No. 6,285,443) so that further details do not require explanation.

Figure 2A:
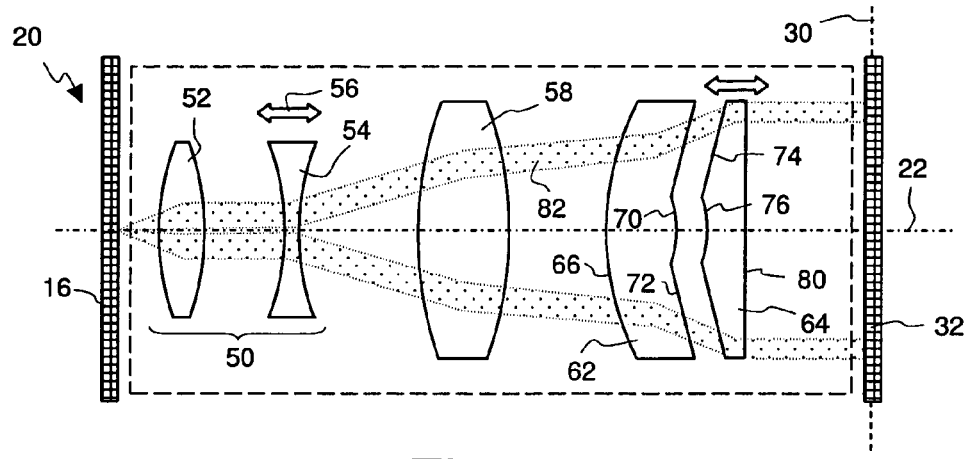
FIGS. 2a to 2c show a beam reshaping objective for the illumination system shown in FIG. 1, according to a first exemplary embodiment of the invention, in different zoom positions.
Figure 2B:
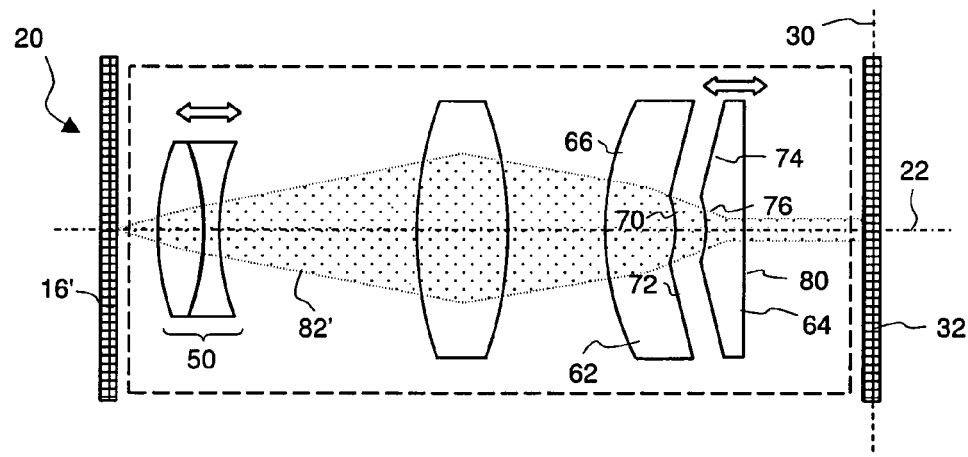
Figure 2C:
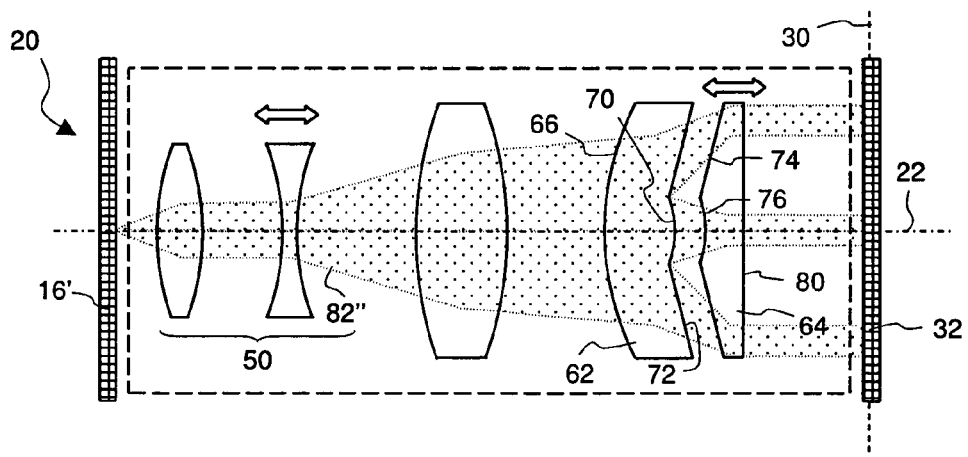

In FIGS. 2a to 2c, a beam reshaping objective 20 according to a first exemplary embodiment, which is suitable for the illumination system 10, is illustrated on an enlarged scale. The beam reshaping objective 20 contains a zoom unit denoted by 50 on the entry side, said zoom unit 50 being indicated in simplified form merely by two individual lenses, namely a convergent lens 52 and a divergent lens 54. The divergent lens 54 is arranged such that it can be moved along the optical axis 22 in the direction of a double-headed arrow 56 in order to enable the focal distance of the zoom unit 50 to be altered.

In the light propagation direction, a further convergent lens 58 adjoins the zoom unit 50. Behind this, a first beam reshaping element 62 and a second beam reshaping element 64 are arranged along the optical axis 22. The first beam reshaping element 62 has a convexly curved entry surface 66 and a first beam reshaping surface 68, which faces the second beam reshaping element 64. The first beam reshaping surface 68 has a convex central region 70 which is surrounded by a conical outer region 72.

The second beam reshaping element 64 has a second beam reshaping surface 74 which faces the first beam reshaping element 62 and behaves with respect to the first beam reshaping surface 68 as a negative with respect to a positive. Accordingly, the second beam reshaping surface 74 has a concave central region 76 and a conical outer region 78 surrounding this central region. A planar rear side of the second beam reshaping element 64 forms an exit surface 80 of the beam reshaping objective 20.

A suitable material for the lenses 52, 54, 58 and the beam reshaping elements 62, 64 is, for example, quartz glass. For very short-wave projection light, e.g. UV light with a wavelength of 157 nm, the material can also be a crystal, particularly fluorite ($CaF_2$), which is sufficiently transparent also for very short wavelengths in the UV domain.

The lenses 52, 54, 58 and also the central regions 70, 76 of the beam reshaping elements 62, 64 do not have to be shaped spherically as shown; they may also have an aspherical shape. Furthermore, the optical elements described may individually actively adjustable or may be manipulated in terms of their position and tilting angle, for example, in order to be able to compensate signs of aging or defects. For adjustment purposes, and particularly for compensating signs of aging, it is also possible to provide lenses which can be deformed using actuators, or to provide spaces that can be filled with gases having different refractive indices.

To correct image distortion, it is moreover possible to carry out subsequent local treatment on surfaces of the optical elements, e.g. by selectively removing material on a nanometer scale. The mounts for the optical elements may be designed such that elements damaged by high-energy radiation can be replaced on site.

FIGS. 2b and 2c show the beam reshaping objective 20 shown in FIG. 2a in another zoom position of the zoom unit 50 and another first optical raster element 16'. For illustrating the function of the beam reshaping objective 20, projection light which, starting from the first optical raster element 16, passes through the beam reshaping objective 20, is indicated in FIGS. 2a to 2c by dotted areas.

In the constellation assumed in FIG. 2a, it is assumed that the parallel projection light 82 striking the first optical raster element 16 expands into an annular bundle. The projection light 82 is further expanded in the beam reshaping objective 20, passing through the conical outer regions 72, 74 of the beam reshaping elements 62, 64 and finally striking the second optical raster element 32 (i.e. the pupil plane 30) as parallel light having an annular intensity distribution.

In the constellation shown in FIG. 2b, the first diffractive optical element 16' transmits also light in the zeroth diffraction order. The divergent lens 54 is moved towards the convergent lens 52, and as a result the projection light 82' is not expanded as far. It therefore passes through the first beam reshaping surface 68 only in the central region 70 and, from this, is focused onto the central region 76 of the second beam reshaping element 64. There it is converted into a substantially parallel light bundle which illuminates a circular disc with a very small diameter in the pupil plane 30, said circular disc being concentric with the optical axis 22. The result is a conventional illumination setting having a low degree of coherence σ.

In FIG. 2c, the zoom unit 50 is set such that the projection light 82" impinges on the central region 70 of the first beam reshaping element 62 and on its conical outer region 72. As explained above with respect to FIG. 2b, the projection light falling on the central region 70 is focused and passes through the pupil plane 30 in a small disc-shaped region about the optical axis 22.

The projection light impinging on the outer region 72 is diverted outwards such that an annular region is illuminated in the pupil plane 30, as is described above with respect to FIG. 2a. In the constellation shown in FIG. 2c, a conventional illumination with a high degree of coherence σ is therefore combined with an annular illumination. This is particularly advantageous in the projection of masks which have different structures, e.g. phase structures and contact holes.

By adjusting the zoom unit 50 and the second beam reshaping element 64, the above-mentioned intensity distributions in the pupil plane 30 can be modified and optimally adapted to the pattern contained in the mask 40.

A second exemplary embodiment of a beam reshaping objective is described below with reference to FIGS. 3a to 3c and is denoted as a whole by 120. The same parts are denoted by the same reference numerals and mutually corresponding parts are denoted by reference numerals increased by 100.

In the beam reshaping objective 120, a zoom unit 150 is arranged behind a first and a second beam reshaping element 162 and 164, respectively, in the beam path. The first beam reshaping element 162 has a first beam reshaping surface 168, which can likewise be sub-divided into a convex central region 170 and an outer region 172 surrounding the central region 170. However, the outer region 172 of the first beam reshaping element 162 is not constructed conically, but concavely. The convex curvature of the central region 170 merges continuously into the concave curvature of the outer region 172. The curvatures of the central region 170 and the outer region 172 may be spherical or aspherical.

A second beam reshaping element 164 has a second beam reshaping surface 174 which behaves with respect to the first beam reshaping surface 168 as a negative to a positive. A light exit surface 180 of the second beam reshaping element 164 is convexly curved in this exemplary embodiment.

Figure 3A:
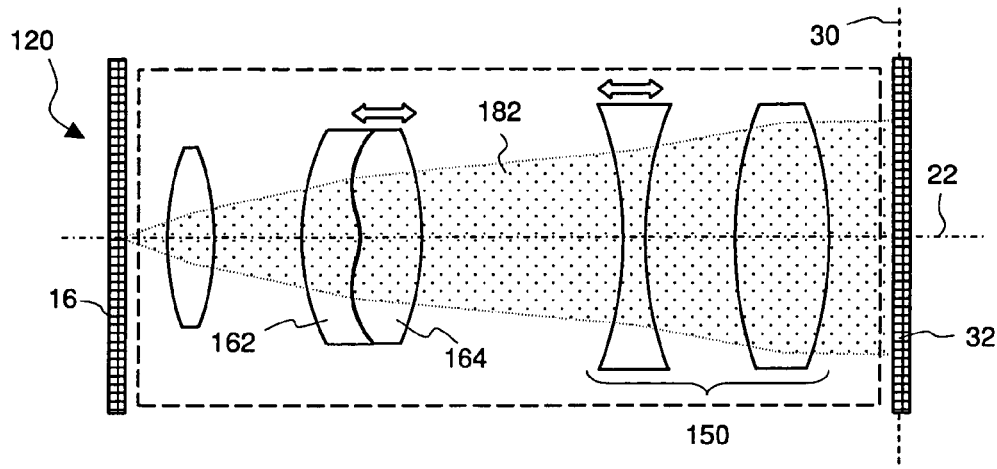
FIGS. 3a to 3c show a beam reshaping objective for the illumination system shown in FIG. 1, according to a second exemplary embodiment of the invention, in different positions of the zoom and beam reshaping elements.

In FIG. 3a, the second beam reshaping element 164, which is mounted such that it may be moved along the optical axis 22, is in contact with the first beam reshaping element 162 so that the two beam reshaping elements 162, 164 together act as a convergent lens. The two beam reshaping elements 162, 164 and the zoom unit 150 convert the divergent projection light 182 emerging from the first optical raster element 16 into an axially parallel light bundle with a large cross-section. This results in a large illuminated area in the pupil plane 30, i.e. a conventional illumination setting with a high degree of coherence σ.

Figure 3B:
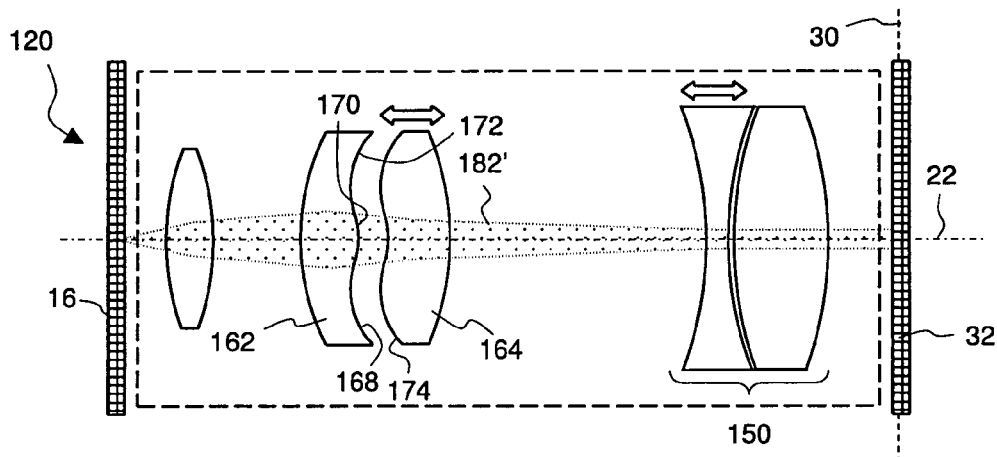

In the configuration shown in FIG. 3b, projection light 182' passes exclusively through the convex central region 170 of the first beam reshaping surface 168 and is therefore focused onto a disc-like region near to the axis in the pupil plane 30. This corresponds to a conventional illumination setting having a very small degree of coherence σ.

Figure 3C:
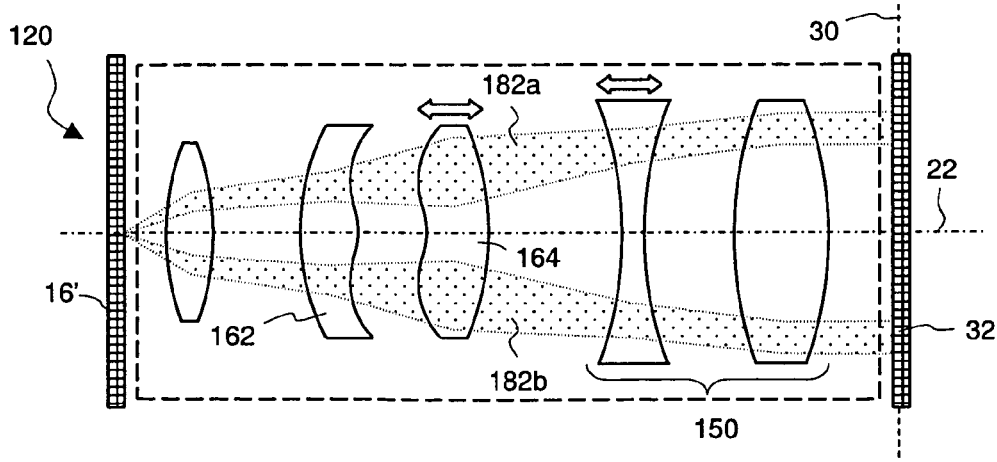

In the constellation shown in FIG. 3c, it is assumed that a first optical raster element 16' generates two divergent light bundles 182a, 182b which pass through the first beam reshaping surface 168 exclusively in the concave outer region 172.

In the configuration shown, the light bundles are diverted further outwards in the axial region and finally generate two diametrically opposed disc-shaped illuminated regions in the pupil plane 30, which corresponds to a dipole illumination setting.

If the first optical raster element 16' generates not only two, but for example four, light bundles, four such disc-like regions are produced in the pupil plane 30, which corresponds to a quadrupole illumination setting. With a suitably designed first optical raster element, it is of course also possible to achieve an annular illumination setting with the arrangement illustrated in FIG. 3c. By adjusting the zoom unit 150 and also the second beam reshaping element 164, it is also possible to modify the above-mentioned intensity distributions in the pupil plane 30 and to adapt them optimally to the pattern contained in the mask 40.

Figure 4A:
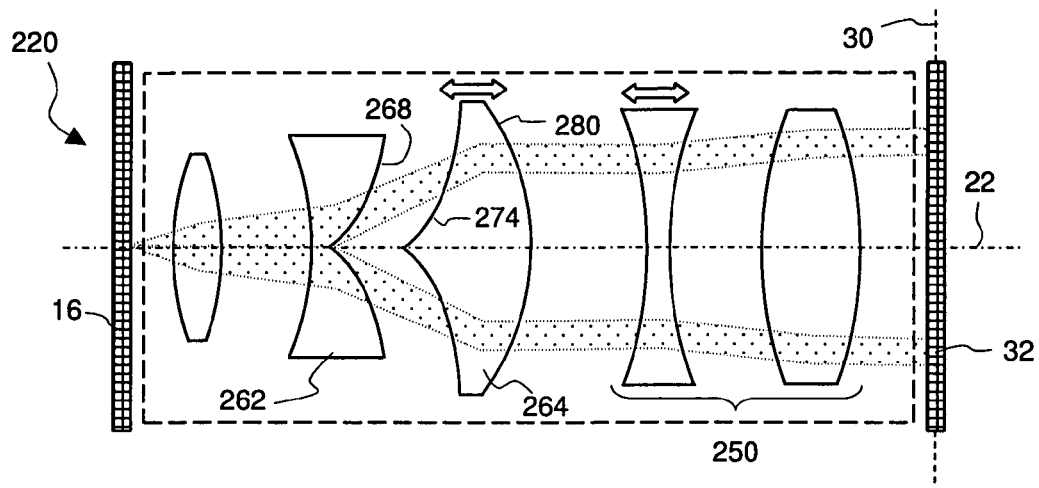
FIGS. 4a to 4c show a beam reshaping objective for the illumination system shown in FIG. 1, according to a third exemplary embodiment of the invention, in different positions of the zoom and beam reshaping elements.
Figure 4B:
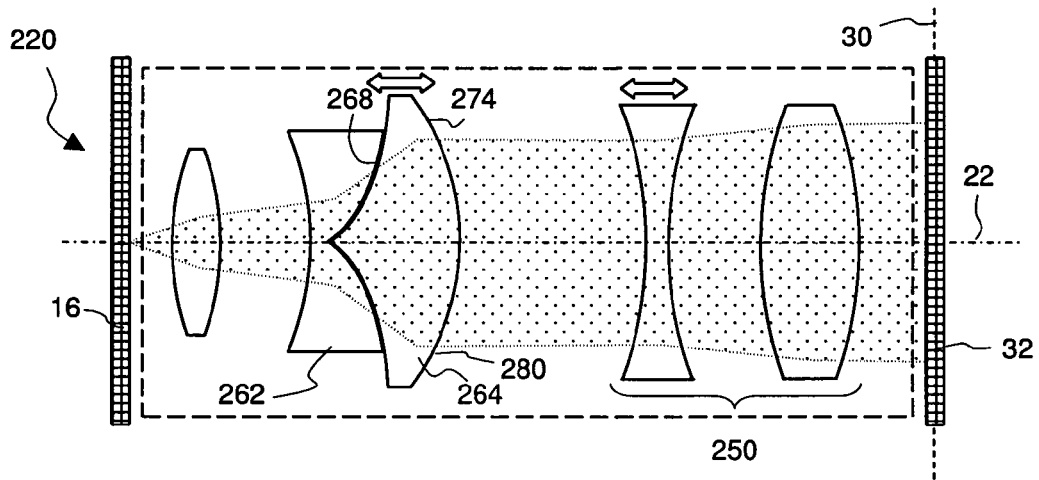
Figure 4C:
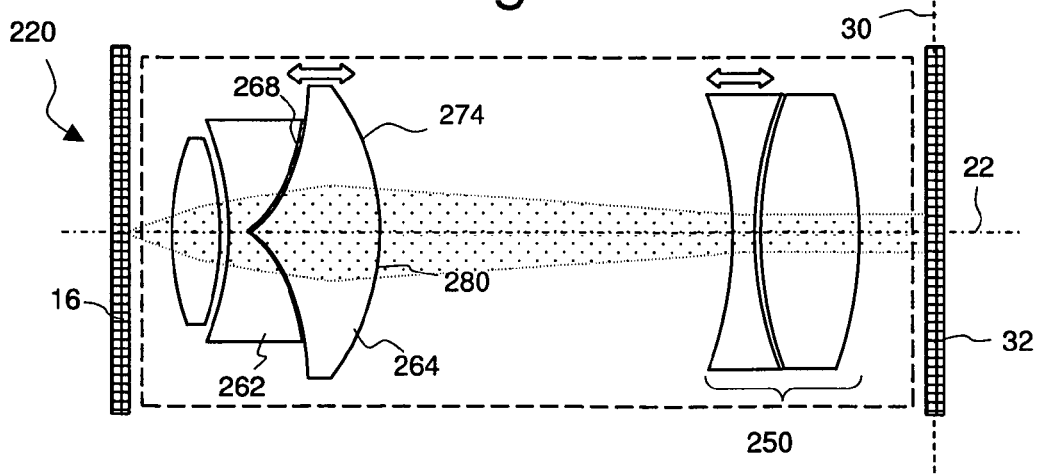

In FIGS. 4a to 4c, a third exemplary embodiment of a beam reshaping objective is shown and denoted in its entirety by 220. The same parts are provided with the same reference numerals and mutually corresponding parts are provided with reference numerals which are increased by 200 with respect to those of the first exemplary embodiment.

The beam reshaping objective 220 comprises a first beam reshaping element 262 which has a first beam reshaping surface 268. The first beam reshaping surface 268 is obtained by rotating a curve segment about the optical axis 22. The curve segment has a continuous curvature distinct from zero and forms an angle α≠90° with the optical axis 22. The form of the curve segment may be circular or, for example, be defined by a spline function. A beam reshaping element having a beam reshaping surface determined in this way will be referred to as "lensacon".

In the exemplary embodiment shown in FIGS. 4a to 4c, the curve segment is convexly curved so that the first beam reshaping surface 268 has a focusing effect. Since the curvature of the first beam reshaping surface 268 is greatest in the region near to the axis, the strongest focusing effect is produced there.

A second beam reshaping element 264 is provided with a second beam reshaping surface 274 complementary thereto and also with a convexly curved light exit surface 280. With suitable determination of the curvatures of the first and second beam reshaping surfaces 268, 274, it is possible to change the shape, but not the overall area of the region illuminated in the pupil plane 22, when the spacing between the two beam reshaping elements 262, 264 is altered. In the course of adjusting the second beam reshaping element 264 or the zoom unit 250, for example, this enables the angular distribution of illumination to be altered without having to accept a generally undesired redistribution of the light energy between illuminated regions in the pupil plane 20.

In FIGS. 4a, 4b and 4c, the beam reshaping objective 220 is shown in different constellations which generate an annular illumination, a conventional illumination with a high degree of coherence σ and a conventional illumination with a low degree of coherence σ.

Figure 5:
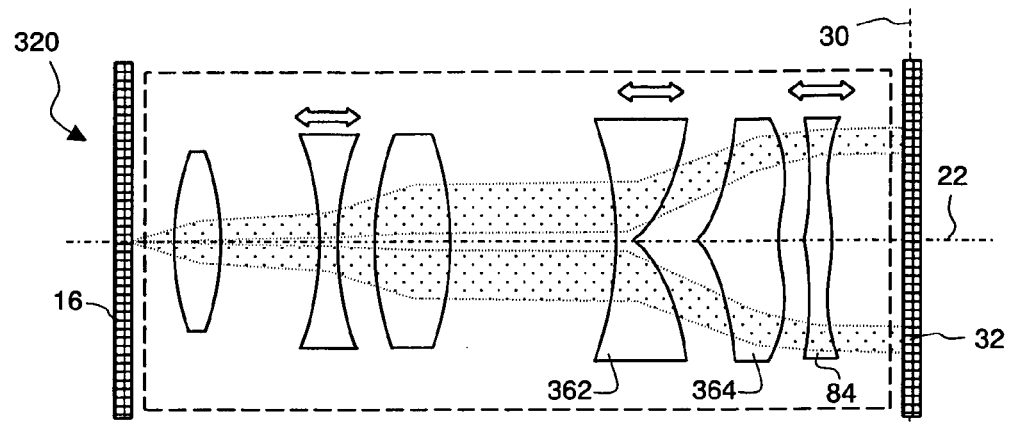
FIG. 5 shows a beam reshaping objective for the illumination system shown in FIG. 1, according to a fourth exemplary embodiment of the invention.

In FIG. 5, a fourth exemplary embodiment of a beam reshaping objective is illustrated and denoted in its entirety by 320. The same parts are provided with the same reference numerals and mutually corresponding parts are provided with reference numerals which are increased by 300 with respect to those of the first exemplary embodiment.

The beam reshaping objective 320 differs from the beam reshaping objective 220 shown in FIGS. 4a to 4c amongst other things in that, arranged behind a second beam reshaping element 364, there is a correcting element 84 which can be moved along the optical axis 22. The correcting element 84 is itself constructed as a lensacon, although the optically effective surfaces only have a comparatively small curvature. The correcting element 84 has the task of at least partially compensating any negative effects that the second beam reshaping element 364 may have on the parallelism of the light bundle.

Figure 6:
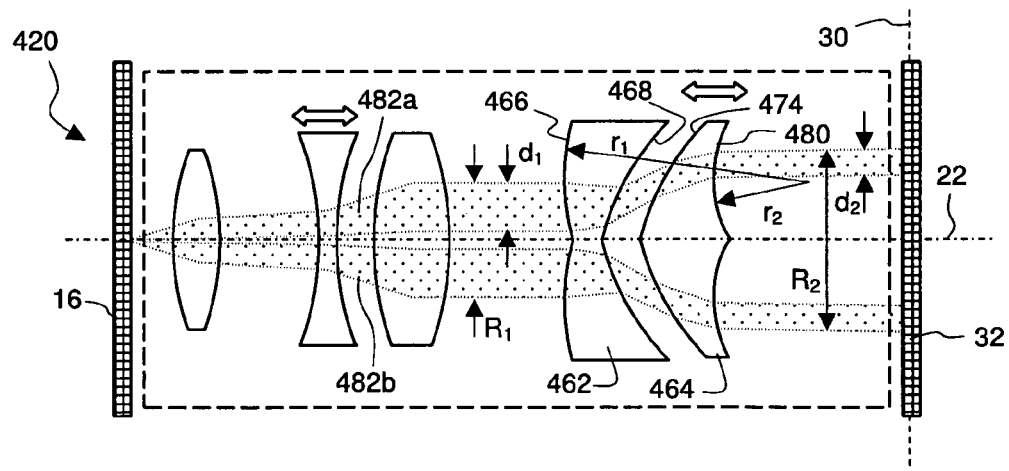
FIG. 6 shows a beam reshaping objective for the illumination system shown in FIG. 1, according to a fifth exemplary embodiment of the invention.

FIG. 6 shows a beam reshaping objective denoted as a whole by 420 according to a fifth exemplary embodiment of the invention. The same parts are provided with the same reference numerals and mutually corresponding parts are provided with reference numerals which are increased by 400 with respect to those of the first exemplary embodiment.

In the beam reshaping objective 420, an entry surface 466 of a first beam reshaping element 462 constructed as a lensacon is shaped such that it can be described by rotating a circle segment around the optical axis 22, said segment being associated with a circle radius $r_1$.

A second beam reshaping element 464, likewise constructed as a lensacon, has a second beam reshaping surface 474 which is constructed complementarily to the first beam reshaping surface 468. Like the entry surface 466, an exit surface 480 of the second beam reshaping element 464 can be described by rotating a circle segment around the optical axis 22. The segment is arranged concentrically with the segment of the entry surface 466 but has a smaller circle radius $r_2 < r_1$.

If the second beam reshaping element 464 is moved along the optical axis 22 until it comes into contact with the first beam reshaping element 462, the two beam reshaping elements 462, 464 have the effect of an afocal optical element. An afocal element is characterized in that the parallelism of a light bundle passing through is maintained.

The first beam reshaping surface 468 is designed such that light bundles 482a, 482b exit the first beam reshaping element 462 in parallel, although inclined in the direction of the incident light bundle. The second beam reshaping element 464 has a substantially inverse function, i.e. the incident parallel light bundles 482a, 482b are merely diverted without thereby impairing the parallelism.

As a whole, the combination of the two beam reshaping element 462, 464 in the position shown in FIG. 6 has the effect that collimated light impinging on the first beam reshaping element 462 is displaced outwards and parallel to the optical axis 22 in such a way that, although the shape of the region surface illuminated in the pupil plane 30 is altered, its overall area remains unaltered.

This is explained in more detail below with reference to the example shown in FIG. 6. It is assumed that the first optical raster element 16 generates a divergent light bundle with an annular cross-section. The three subsequent lenses convert this into parallel light bundles. In this case, the light bundles 482a, 482b do not represent individual light bundles but a section through a ring-shaped light bundle. The width of the ring is denoted by $d_1$ and the total diameter of the ring is denoted by $R_1$.

After the two beam reshaping elements 462, 464 have been passed through, the total diameter has increased to the value $R_2$, whilst the ring width is reduced by the beam reshaping elements 462, 464 to a value $d_2 < d_1$.

Figure 7:
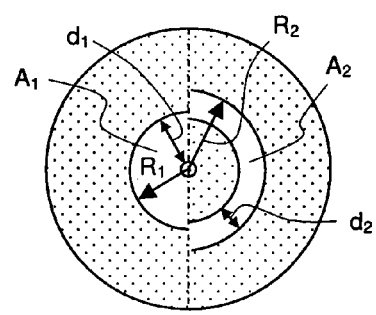
FIG. 7 shows an intensity distribution in a plane in front of the beam reshaping elements and in the pupil plane.

In FIG. 7 the geometries of the ring-shaped radiation distributions are illustrated in a plane directly in front of the entry surface 466 (left half) and a plane directly behind the exit surface 480 (right half). The cross-sectional areas denoted by $A_1$ and $A_2$ are at least substantially identical. It is now assumed that the second beam reshaping element 464 is displaced along the optical axis 22 so as to obtain a ring-shaped illumination of the pupil plane 30 with an even greater diameter. Since the total illuminated area remains constant irrespective of the distance between the beam reshaping elements 462, 464, the area $A_2'$ obtained after increasing the distance between the beam reshaping elements 462, 464 does not significantly change, i.e. $A_2'=A_2$. As a further consequence, the portion of light impinging with a particular angle of incidence onto a subsequent field plane has the same intensity in both illumination settings. Contrary, in conventional axicon elements having conical beam reshaping surfaces this intensity generally alters when the spacing between the beam reshaping elements is changed.

Figure 8A:
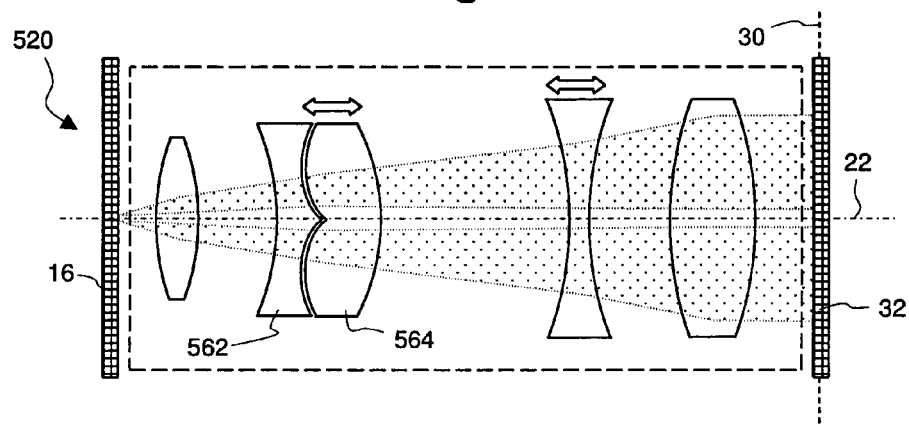
FIGS. 8a and 8b show a beam reshaping objective for the illumination system shown in FIG. 1, according to a sixth exemplary embodiment of the invention, in different positions of the beam reshaping elements.
Figure 8B:
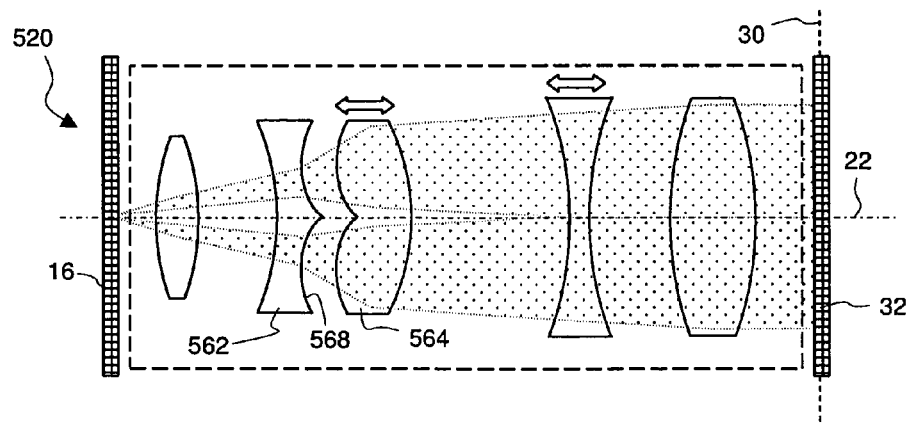

A sixth exemplary embodiment of a beam reshaping objective is illustrated in FIGS. 8a and 8b, and denoted as a whole by 520. The same parts are provided with the same reference numerals and mutually corresponding parts are provided with reference numerals which are increased by 500 with respect to those of the first exemplary embodiment.

In the beam reshaping objective 520, a first beam reshaping surface 562 is constructed similar to the light exit surface 480 of the second beam reshaping element 464 according to the fifth exemplary embodiment described above. In the present embodiment, however, the curved segment whose rotation defines the first beam reshaping surface 568 does not necessarily have to be a circle segment. If compared with the third exemplary embodiment illustrated in FIGS. 4a to 4c, it should be further noted that the first beam reshaping surface 568 has surface normals that extend parallel to the optical axis and are located on a circle which is concentric with the optical axis 22. This produces a toroidal form of the first beam reshaping surface 568. FIGS. 8a and 8b show constellations which produce a ring field illumination and a conventional illumination having a high degree of coherence σ, respectively.

Figure 9A:
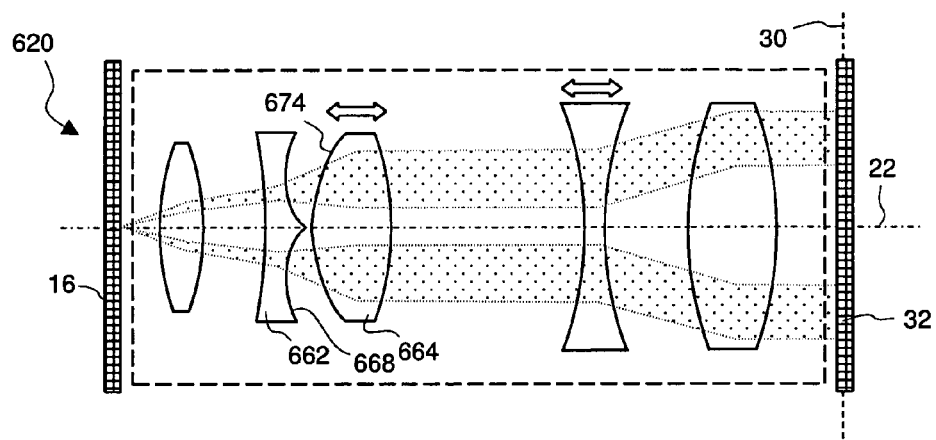
FIGS. 9a and 9b show a beam reshaping objective for the illumination system shown in FIG. 1; according to a seventh exemplary embodiment of the invention, in different positions of the beam reshaping elements.
Figure 9B:
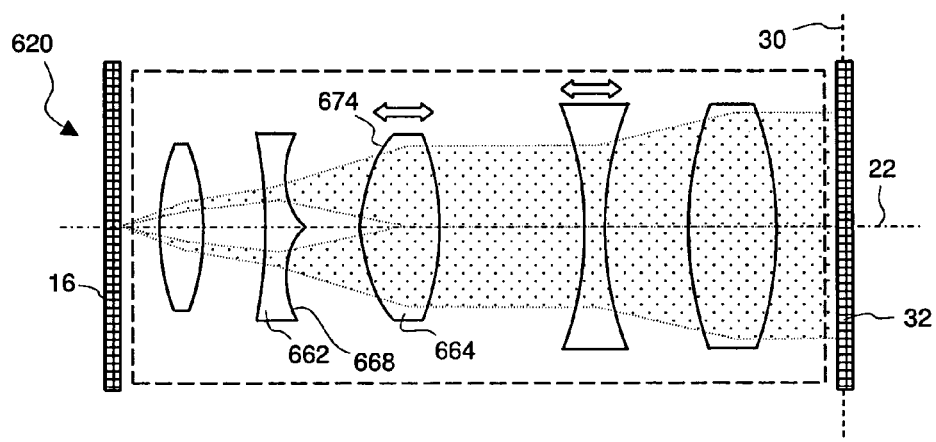

In FIGS. 9a and 9b, a beam reshaping objective 620 is shown according to a seventh exemplary embodiment of the invention. The same parts are provided with the same reference numerals and mutually corresponding parts are provided with reference numerals which are increased by 600 with respect to those of the first exemplary embodiment.

The beam reshaping objective 620 differs from the sixth exemplary embodiment shown in FIGS. 8a and 8b in that a second beam reshaping surface 674 of a second beam reshaping element 664 is not constructed complementarily to a first beam reshaping surface 668 of a first beam reshaping element 662. The combination of a toroidal beam reshaping surface 668 in the first beam reshaping element 662 and a lensacon as the second beam reshaping element 664 is particularly suitable for annular illumination settings having a homogenous intensity distribution.

Figure 10A:
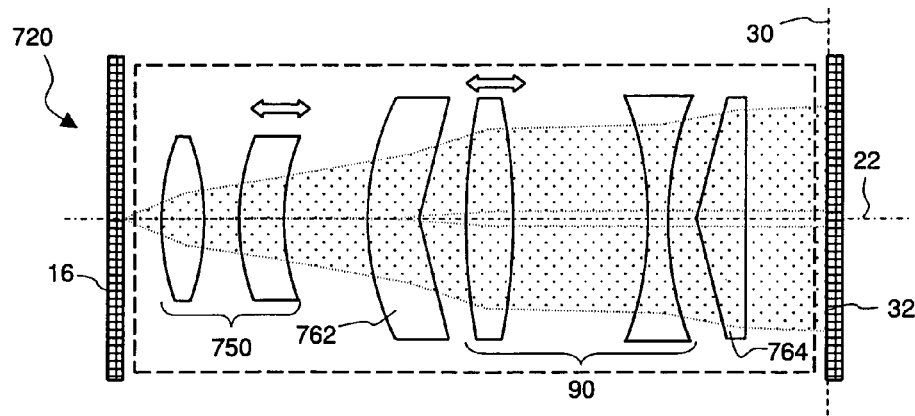
FIGS. 10a to 10c show a beam reshaping objective for the illumination system shown in FIG. 1, according to an eighth exemplary embodiment of the invention, in different positions of the zoom and beam reshaping elements.
Figure 10B:
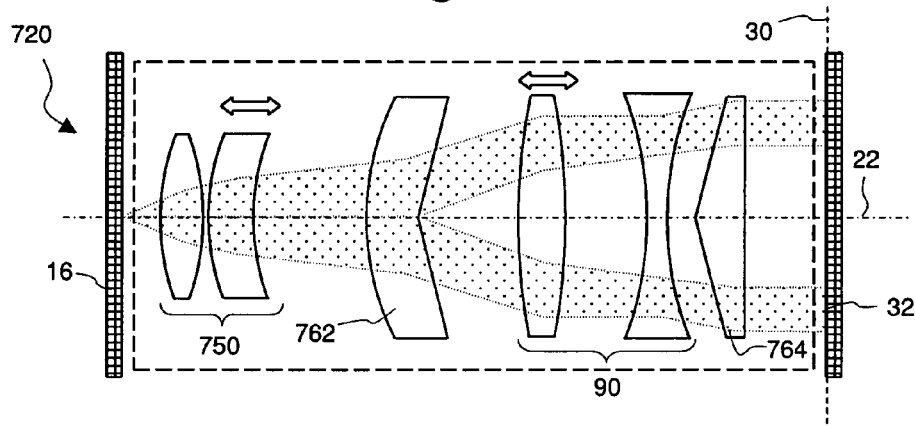
Figure 10C:
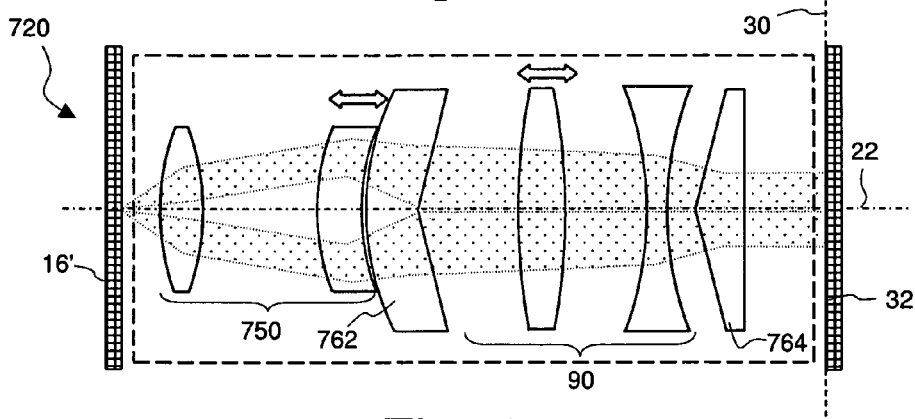

A beam reshaping objective according to an eighth exemplary embodiment of the invention is illustrated in FIGS. 10a to 10c and denoted as a whole by 720. The same parts are provided with the same reference numerals and mutually corresponding parts are provided with reference numerals which are increased by 700 with respect to those of the first exemplary embodiment.

The beam reshaping objective 720 is characterized in that two arbitrary beam reshaping elements 762, 764 are non-adjustably fixed with respect to the optical axis 22. The lack of an adjustment option is compensated for in this exemplary embodiment by arranging a zoom unit 90, indicated by a positive and a negative lens, between the beam reshaping elements 762, 764. Further zoom units, for instance a zoom unit 750, can be arranged in front of and behind the beam reshaping elements 762, 764. By adjusting the zoom units 90, 750 it is possible to set different ring field illuminations (FIGS. 10a and 10b) or even conventional illuminations (FIG. 10c). The non-adjustably fixed beam reshaping elements are advantageous in that they cannot tilt, as is frequently the case with adjustable beam reshaping elements.

Figure 11A:
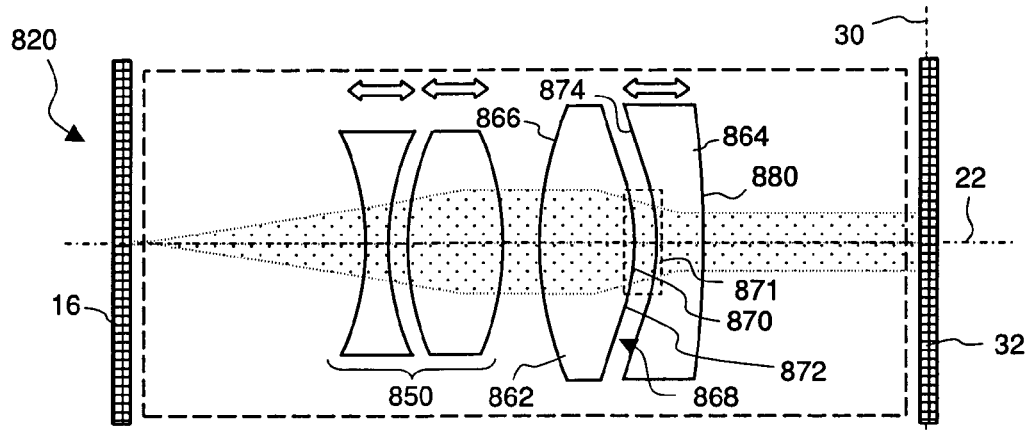
FIGS. 11a to 11c show a beam reshaping objective for the illumination system shown in FIG. 1, according to an ninth exemplary embodiment of the invention, in different positions of the zoom and beam reshaping elements.
Figure 11B:
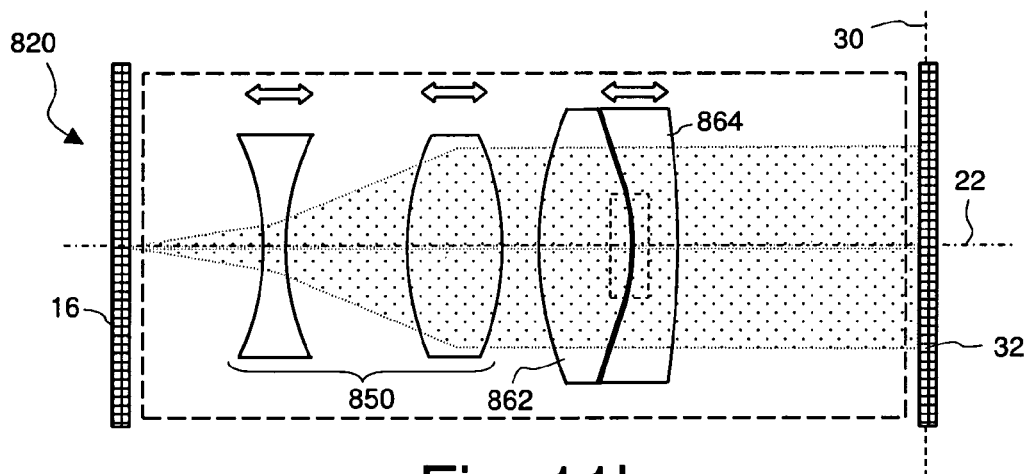
Figure 11C:
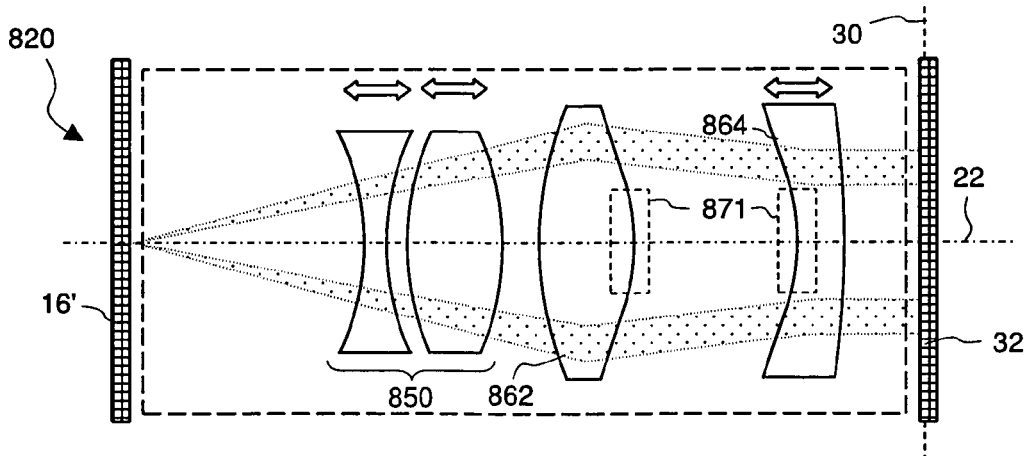

In FIGS. 11a, 11b and 11c a ninth exemplary embodiment of a beam reshaping objective is shown in different constellations and denoted in its entirety by 820. The same parts are provided with the same reference numerals and mutually corresponding parts are provided with reference numerals which are increased by 800 with respect to those of the first exemplary embodiment.

In contrast to the embodiments described above, a zoom unit 850 is not located behind, but in front of two beam reshaping elements 862, 864. The beam reshaping element 862 has a convex entry surface 866 and a first beam reshaping surface 868. A central convex region 870 of the first beam reshaping surface 868 is surrounded by a convex conical outer region 872. In FIGS. 11a to 11c a cylinder indicated by 871 and drawn in broken lines defines the diameter of the central region 870. The curvature of the central region 870, which may be aspherical, is continuously reduced to zero at the outer boundary of the central region 870. This ensures a smooth transition between the central region 870 and the conical outer region 872.

The second beam reshaping element 864 has a second beam reshaping surface 874 that is formed as a negative with respect to the first beam reshaping surface 868. An exit surface 880 of the second beam reshaping element 864 is, in the embodiment shown, convexly curved.

FIG. 11a shows the beam reshaping objective 820 in a constellation that produces a conventional illumination setting having a low degree of coherence σ. By adjusting the zoom unit 850 and moving the second beam reshaping element 864 along the optical axis 22 such that it contacts the first beam reshaping element 862, a conventional illumination setting with a higher degree of coherence σ is obtained. This constellation is shown in FIG. 11b.

In the constellation shown in FIG. 11c it is assumed that a first optical raster element 16' produces a light bundle having an annular intensity distribution. This distribution is reshaped by the beam reshaping objective 820 so that an annular illumination setting is achieved with the desired ring diameter and ring width. By moving the beam reshaping elements 862, 864 along the optical axis 22, these ring parameters may be varied.

The curved central region 870 of the first beam reshaping surface 868 and its counterpart on the second beam reshaping surface 874 has the advantage that, in the case of conventional illumination settings, an intensity loss directly on the optical axis 22 is avoided. In conventional conical reshaping elements such a loss occurs due to the central tip of the cones.

Furthermore, it has been discovered that by providing a convex first beam reshaping surface 868 and a concave second beam reshaping surface 874, the light is more evenly distributed over the illumined ring-shaped area than is the case with axicon elements having a concave first beam reshaping surface and a convex second beam reshaping surface.

Figure 12A:
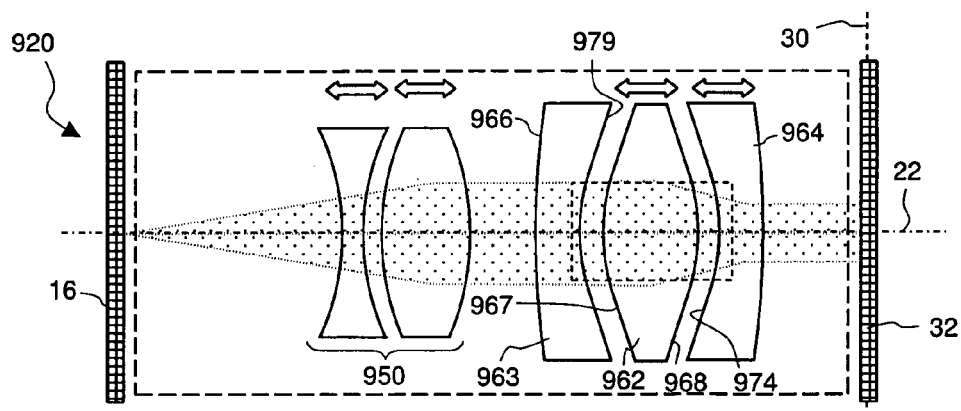
FIGS. 12a to 12c show a beam reshaping objective for the illumination system shown in FIG. 1, according to a tenth exemplary embodiment of the invention, in different positions of the zoom and beam reshaping elements.
Figure 12B:
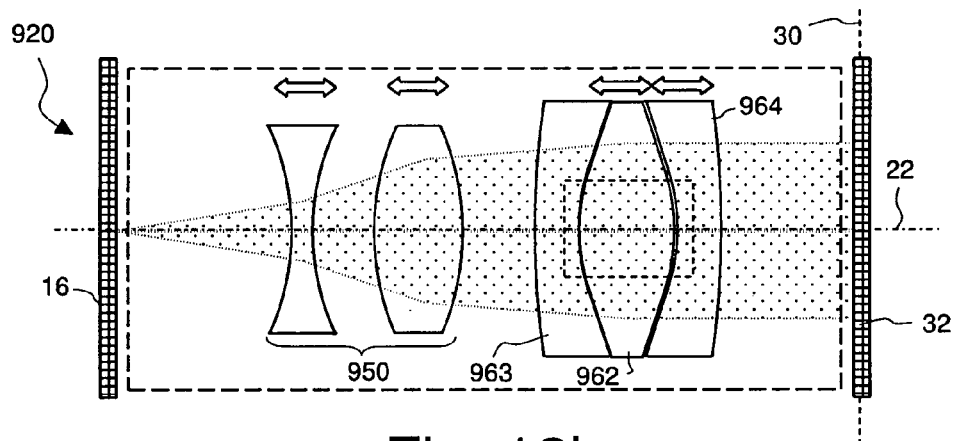
Figure 12C:
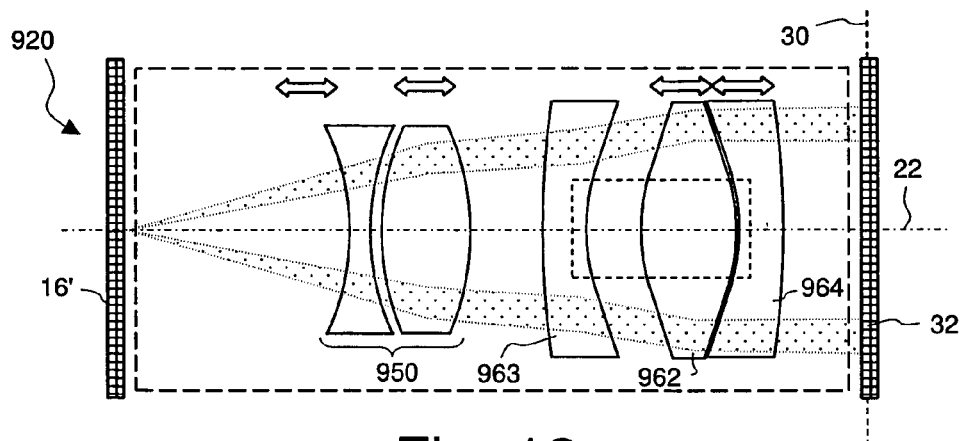

A tenths exemplary embodiment of the beam reshaping objective is illustrated in FIGS. 12a, 12b and 12c and denoted in its entirety by 920. The same parts are provided with the same reference numerals and mutually corresponding parts are provided with reference numerals which are increased by 900 with respect to those of the first exemplary embodiment.

The beam reshaping objective 920 differs from the beam reshaping objective 820 shown in FIGS. 11a to 11c mainly in that there are three beam reshaping elements 962, 963, 964 instead of only two. The second beam reshaping element 964 has substantially the same shape as the second beam reshaping element 864 shown in FIGS. 11a to 11c. The first beam reshaping element 962 has a first beam reshaping surface 968 that is a negative of a second beam reshaping surface 974 of the second beam reshaping element 964. An entry surface of the first beam reshaping element 962 forms a third beam reshaping surface 967 and has the same convex shape as the other surface 968 of the first beam reshaping element 962.

The third beam reshaping element 963 has a convex entry surface 966 and a fourth beam reshaping surface 979 that is a negative of the adjacent third beam reshaping surface 967. Although all four beam reshaping surfaces 968, 974, 967 and 979 have the same convex or concave geometry, it is to be understood that each pair of adjacent beam reshaping surfaces may have different geometries, or that even all geometries may be different.

FIG. 12*a* shows the beam reshaping objective 920 in a constellation that produces a conventional illumination setting with a low degree of coherence σ. For adjusting the illumination setting, the first and the second beam reshaping elements 962, 964 may be moved along the optical axis 22.

For producing a conventional illumination setting with a higher degree of coherence σ, the three beam reshaping elements 962, 963, 964 are brought into contact. The zoom unit 950 may then be used for further adjusting the degree of coherence σ. This is shown in the constellation of FIG. 12*b*.

FIG. 12*c* shows the beam reshaping objective 920 in a third constellation in which a first diffractive optical element 16' produces an annular intensity distribution. The zoom unit 950 may be adjusted for setting a desired ring width, whereas the first and second beam reshaping elements 962, 964 may be moved along the optical axis 22 in order to determine the ring diameter.

Figure 13:
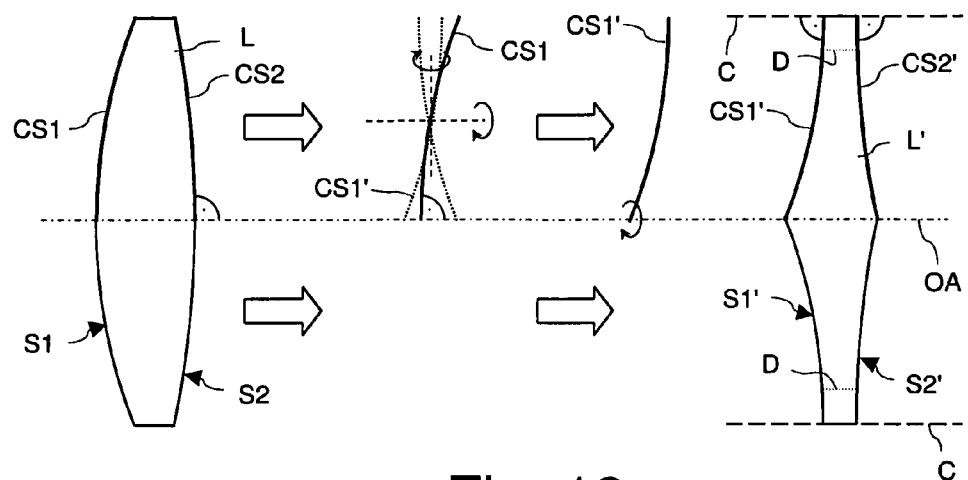
FIG. 13 shows a transformation of a conventional aspherical lens into an inverted lens.

FIG. 13 illustrates a design rule that allows to develop novel optical elements that may be used as beam reshaping elements, but also as optical elements in other optical systems, for example in the field of optical surgery and machining materials.

On the left side of FIG. 13 a conventional lens L is shown having aspherical surfaces S1, S2. These surfaces S1, S2 may be described by rotating a curve segment CS1 and CS2, respectively, around an optical axis OA of an optical system. If the curve segment CS that defines the first surface S1 is rotated by 180° around a horizontal and a vertical axis, as is shown in the middle of FIG. 13, a transformed curve segment CS1' is obtained. By rotating the transformed curve segment CS1' around the optical axis OA, an "inverted" surface S1' is obtained.

This inverted surface S1' is characterized by a central tip on the optical axis OA. If the original surface S1 was concave instead of convex, the inverted surface S1' would have a central hole on the optical axis OA.

Furthermore, the inverted surface S1' is characterized in that the surface perpendicularly intersects a regular cylinder surface that is concentric with the optical axis OA and has the same diameter as the original lens L. In FIG. 13 this cylinder surface is denoted by broken lines C. The perpendicular intersection is a result of the fact that the vertex of a conventional lens intersects the optical axis perpendicularly.

The same considerations apply, mutatis mutandis, to the transformation of the second surface S2 of the lens L.

The inverted lens L' resulting from this design rule is therefore a lensacon in the sense described above, but with the additional property of having surfaces that perpendicularly intersect a surface C of a regular cylinder that is concentric with the optical axis OA. Of course, this property is not principally lost if the lens L' would be reduced in diameter, as is indicated in FIG. 13 by dotted lines D, with respect to the initial lens L.

Figure 14:
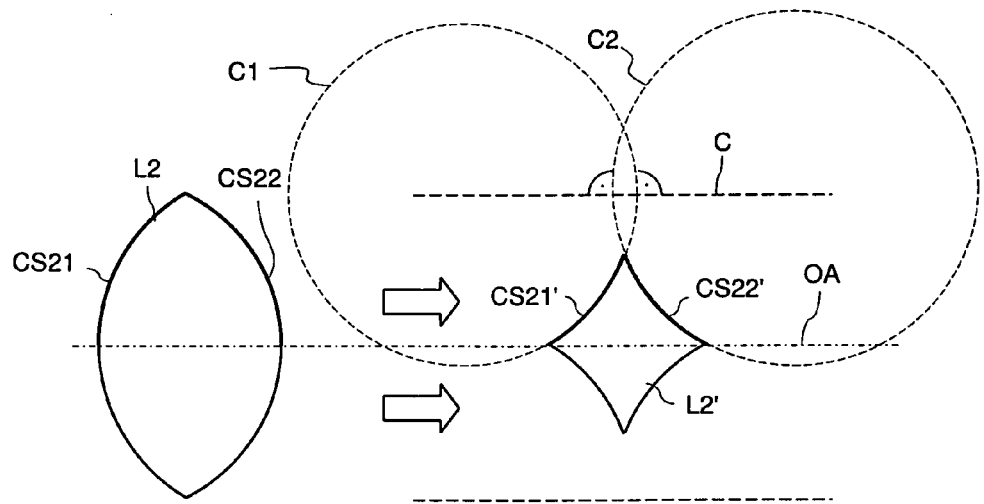
FIG. 14 shows a transformation of a conventional spherical lens into an inverted lens.

This is also illustrated in FIG. 14 that differs from the example shown in FIG. 13 in that the original lens L2 has spherical surfaces. The curve segments CS21' CS22' that define the surfaces of the inverted lens L2' are therefore segments of circles C1, C2 that are indicated in FIG. 14 by broken lines. The circles C1, C2 both perpendicularly intersect a common regular cylinder surface C, although the transformed lens L2' has been truncated so far that the curve segments CS21', CS22' as such do not reach the cylinder surface C.

Figure 15A:
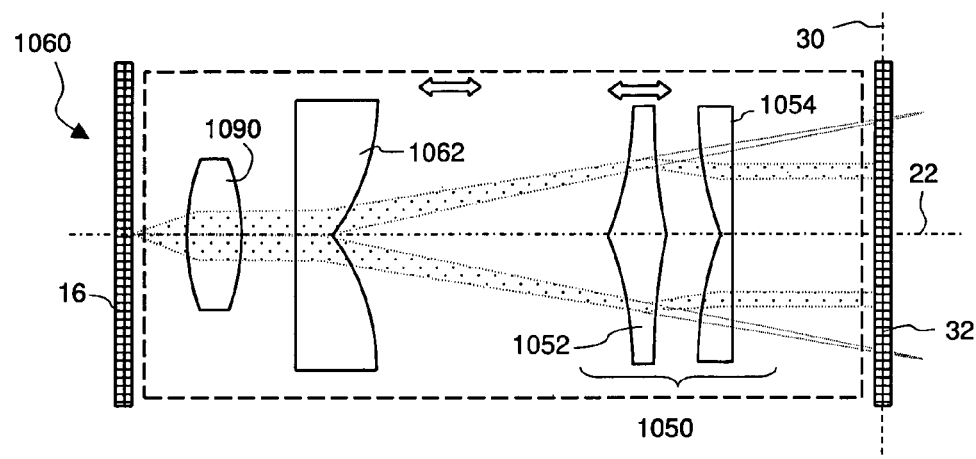
FIGS. 15a and 15b show a beam reshaping objective for the illumination system shown in FIG. 1, according to an eleventh exemplary embodiment of the invention, in different positions of the zoom and beam reshaping elements.
Figure 15B:
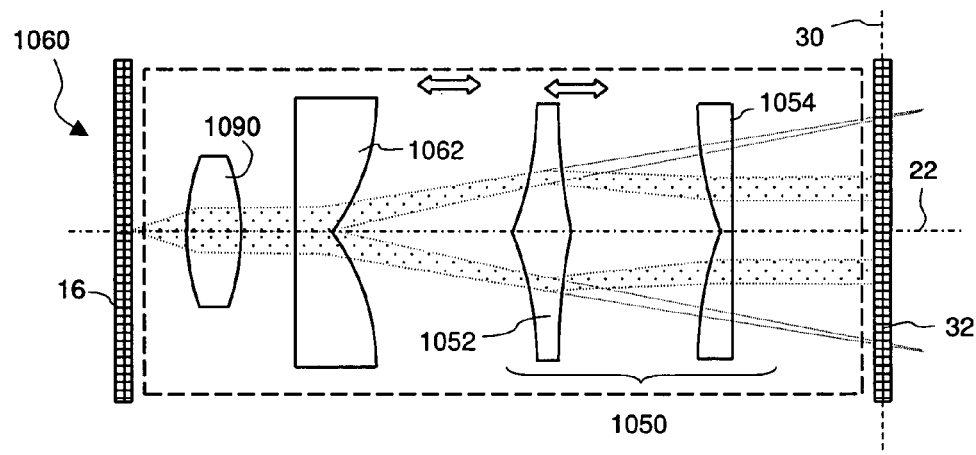

The inverted lenses L', L2' have also "inverted" optical properties. This is illustrated in FIGS. 15*a*, 15*b* that show a beam reshaping objective for the illumination system shown in FIG. 1 according to an eleventh exemplary embodiment. The same parts are provided with the same reference numerals and mutually corresponding parts are provided with reference numerals which are increased by 1000 with respect to those of the first exemplary embodiment.

The beam reshaping objective, which is denoted in its entirety by 1060, comprises a positive lens 1090, a first beam reshaping element 1062 having the form of a lensacon similar to element 268 shown in FIGS. 4*a* to 4*c*, and two inverted zoom lenses 1052, 1054 that are both constructed according to the design rule described above with reference to FIGS. 13 and 14. The first inverted zoom lens 1052 has a positive refractive power, whereas the second inverted zoom lens 1054 has a negative refractive power. As becomes clear from FIGS. 15*a* and 15*b*, displacing the first inverted zoom lens 1052 along the optical axis 1022 results in a change of the diameter of the illuminated ring on the second diffractive optical element 32. In contrast to conventional non-inverted zoom lenses, however, the ring width automatically increases if the ring diameter is reduced by displacing the first inverted zoom lens 1052 towards the lensacon 1062. This ensures that the total area illuminated in the pupil plane remains constant irrespective of the ring parameters.

The invention claimed is:

1. A beam reshaping unit for an illumination system of a microlithographic projection exposure apparatus, comprising: a) an optical axis, b) a first beam reshaping element having a first beam reshaping surface, c) a second beam reshaping element having a second beam reshaping surface which faces the first beam reshaping surface, wherein the first beam reshaping surface and the second beam reshaping surface are rotationally symmetrical with respect to the optical axis, and wherein at least the first beam reshaping surface has a curved non-conical region.

2. The beam reshaping unit of claim 1, wherein the curvature of the first beam reshaping surface within the curved region is finite.

3. The beam reshaping unit of claim 1, wherein the region is a central region centered around the optical axis.

4. A beam reshaping unit for an illumination system of a microlithographic projection exposure apparatus, comprising: a) an optical axis, b) a first beam reshaping element having a first beam reshaping surface, c) a second beam reshaping element having a second beam reshaping surface which faces the first beam reshaping surface, wherein the first beam reshaping surface and the second beam reshaping surface are rotationally symmetrical with respect to the optical axis, and wherein at least the first beam reshaping surface has a central curved non-conical region that is surrounded by an outer region that is conical or has a curvature which is qualitatively opposed to the curvature of the central region.

5. The beam reshaping unit of claim 4, wherein the curvature is finite at the borderline between the central region and the conical outer region.

6. The beam reshaping unit of claim 4, wherein the curvature in the central region merges continuously into the curvature in the outer region.

7. The beam reshaping unit of claim 4, wherein the first beam reshaping element is mounted in front of the second beam reshaping element in a light propagation direction, and wherein the central region of the first beam reshaping surface is convexly curved.

8. The beam reshaping unit of claim 7, wherein the central region is surrounded by a concave region.

9. The beam reshaping unit of claim 4, wherein the first beam reshaping element has a convex light entry surface.

10. The beam reshaping unit of claim 4, wherein the second beam reshaping element has a planar or convex light exit surface.

11. The beam reshaping unit of claim 4, wherein the second beam reshaping surface is formed as the negative of the first beam reshaping surface so that the first and the second beam reshaping surfaces may be substantially seamlessly joined together.

12. The beam reshaping unit of claim 4, wherein the beam reshaping unit comprises a zoom unit having at least one optical element that is configured to be displaced along the optical axis.

13. The beam reshaping unit of claim 12, wherein the correcting element has at least one beam reshaping surface that is defined by rotating a curve segment around the optical axis, said curve segment having a continuous curvature being distinct from zero and forming an angle $\alpha \neq 90°$ with the optical axis.

14. A microlithographic projection exposure apparatus, comprising the illumination system of claim 13.

15. The beam reshaping unit of claim 4, wherein an entry surface of the first beam reshaping element and an exit surface of the second beam reshaping element are each defined by rotating a circle segment around the optical axis, said curve segment forming an angle $\alpha \neq 90°$ with the optical axis.

16. The beam reshaping unit of claim 15, wherein the circle segments are concentric.

17. The beam reshaping unit of claim 4, comprising a third beam reshaping element having a third beam reshaping surface that is formed as the negative of a fourth beam reshaping surface of the first beam reshaping element so that the third and the fourth beam reshaping surfaces may be substantially seamlessly joined together.

18. The beam reshaping unit of claim 4, wherein the beam reshaping unit comprises a zoom unit having at least one optical element that is configured to be displaced along the optical axis.

19. The beam reshaping unit of claim 18, wherein the zoom unit is located, in the light propagation direction, in front of the beam reshaping elements.

20. The beam reshaping unit of claim 18, wherein the zoom unit is located, in the light propagation direction, behind the beam reshaping elements.

21. The beam reshaping unit of claim 4, wherein the spacing between the two beam reshaping elements is adjustable in the direction of the optical axis.

22. The beam reshaping unit of claim 4, wherein the two beam reshaping elements are non-adjustably fixed with respect to the optical axis, and wherein at least one zoom unit is arranged between the two beam reshaping elements.

23. An illumination system of a microlithographic projection exposure apparatus comprising the beam reshaping unit of claim 4.

24. An microlithographic projection exposure apparatus, comprising the illumination system of claim 23.

* * * * *

UNITED STATES PATENT AND TRADEMARK OFFICE
CERTIFICATE OF CORRECTION

PATENT NO. : 7,542,217 B2  Page 1 of 1
APPLICATION NO. : 11/015312
DATED : June 2, 2009
INVENTOR(S) : Wolfgang Singer et al.

It is certified that error appears in the above-identified patent and that said Letters Patent is hereby corrected as shown below:

Column 15, line 21, Claim 12, delete "The beam reshaping unit of claim 4, wherein the beam reshaping unit comprises a zoom unit having at least one optical element that is configured to be displaced along the optical axis." insert --The beam reshaping unit of claim 11, wherein the beam reshaping unit comprises a correcting element and a mechanism for displacing the correcting element along the optical axis.--.

Column 15, line 31, Claim 14, delete "A microlithographic projection exposure apparatus, comprising the illumination system of claims 13." insert --The beam reshaping unit of claim 4, comprising a third beam reshaping element having a third beam reshaping surface that is formed as the negative of a fourth beam reshaping surface of the first beam reshaping element so that the third and the fourth beam reshaping surfaces may be substantially seamlessly joined together.--.

Column 16, line 32, Claim 24, delete "An" insert --A--.

Signed and Sealed this

Eleventh Day of August, 2009

David J. Kappos
*Director of the United States Patent and Trademark Office*